United States Patent [19]
Koyama

[11] Patent Number: 5,517,044
[45] Date of Patent: May 14, 1996

[54] NON-VOLATILE SEMICONDUCTOR MEMORY DEVICE HAVING THIN FILM TRANSISTORS EQUIPPED WITH FLOATING GATES

[75] Inventor: Shoji Koyama, Tokyo, Japan

[73] Assignee: NEC Corporation, Tokyo, Japan

[21] Appl. No.: 359,865

[22] Filed: Dec. 20, 1994

Related U.S. Application Data

[63] Continuation of Ser. No. 217,019, Mar. 24, 1994, abandoned, which is a continuation of Ser. No. 14,758, Feb. 8, 1993, abandoned.

[30] Foreign Application Priority Data

Feb. 7, 1992 [JP] Japan .................... 4-057107

[51] Int. Cl.[6] .................. H01L 29/788; H01L 29/94; H01L 31/062; H01L 27/105
[52] U.S. Cl. ............. 257/316; 257/317; 257/365; 257/401; 257/206
[58] Field of Search ................... 257/49, 51, 52, 257/57, 59, 60, 61, 66, 67, 69, 70, 72, 218, 261, 262, 263, 314, 315, 316, 318, 319, 326, 328, 365, 368, 377, 401, 406, 508, 202, 203, 204, 205, 206, 317, 320, 321, 322, 323; 365/185

[56] References Cited

U.S. PATENT DOCUMENTS

| | | | |
|---|---|---|---|
| 4,667,217 | 5/1987 | Janning | 257/326 |
| 4,980,732 | 12/1990 | Okazawa | 257/326 |
| 5,338,956 | 8/1994 | Nakamura | 257/322 |

FOREIGN PATENT DOCUMENTS

| | | | |
|---|---|---|---|
| 59-82770 | 5/1984 | Japan | 257/316 |
| 62-265768 | 11/1987 | Japan | 257/316 |

Primary Examiner—Sara W. Crane
Assistant Examiner—Alice W. Tang
Attorney, Agent, or Firm—Burns, Doane, Swecker & Mathis

[57] ABSTRACT

A non-volatile semiconductor memory device is constituted by a plurality of thin film memory transistors, each having a control gate electrode formed on an insulating film on a semiconductor substrate, a first gate insulating film covering said control gate electrode, a floating gate electrode formed on said first gate insulating film, a second gate insulating film provided on said floating gate electrode, a channel region of a first conductivity type semiconductor film provided on said second gate insulating film, and source/drain regions of a second conductivity type semiconductor film formed with said channel region being interposed therebetween. A memory device such as an EPROM or FEPROM is formed by using the above thin film memory transistors. The invention provides a semiconductor memory device which operates at a high speed and in which it is possible to achieve a high integration.

1 Claim, 6 Drawing Sheets

NON-VOLATILE SEMICONDUCTOR MEMORY DEVICE HAVING THIN FILM TRANSISTORS EQUIPPED WITH FLOATING GATES

This application is a continuation of application Ser. No. 08/217,019, filed Mar. 24, 1994 now abandoned, which is a continuation of application Ser. No. 08/014,758, filed Feb. 8, 1993, now abandoned.

BACKGROUND OF THE INVENTION

1. Field of the Invention

The present invention relates to a non-volatile semiconductor memory device, and more particularly to a non-volatile semiconductor memory device such as an erasable programmable read-only memory (hereinafter referred to as an "EPROM") in which ultraviolet light is used for erasing data and an electrically erasable programmable read-only memory (hereinafter referred to as an "EEPROM") in which the data erasing is effected electrically.

2. Description of the Related Art

A conventional non-volatile semiconductor memory device is shown in FIGS. 1A and 1B which are a longitudinal cross-sectional view and a transverse cross-sectional view of the device, respectively. As shown therein, the device includes a semiconductor substrate 1; a drain region 2c and a source region 2d constituted by n-type impurity diffusion layers, respectively; a floating gate electrode 4; a gate insulating film 3 (hereinafter referred to as "C-FG gate insulating film") disposed between a channel region and the floating gate electrode 4; a control gate electrode 6; a gate insulating film 5 (hereinafter referred to as "FG-CG gate insulating film") disposed between the floating gate electrode 4 and the control gate electrode 6; an interlayer insulating film 7; and a field insulating film 8. Under the field insulating film 8, there is a channel stopper (now shown in the drawings) constituted by a highly doped diffusion layer.

In the conventional memory transistor described above, the changes in threshold values depend on the electric charge accumulated in the floating gate 4. The storing of data is effected by the electric charge and the reading of the data is effected by the conversion of the changes in the threshold values into channel currents.

The data writing or programming is effected mainly through the injection of hot electrons from the channel region, the Fowler-Nordheim tunneling phenomena which takes place in the C-FG gate insulating film 3, and the avalanche breakdown caused by the injection of hot holes.

An equivalent circuit diagram of an ordinary memory array which is used in an EPROM or a flash EEPROM (hereinafter referred to as "FEPROM") is shown in FIG. 2. Here, $Q_{M i,j}$ (i=1,2, j=1,2) are memory transistors; $X_1$, $X_2$ are word lines connecting the control gate electrodes 6 shown in FIGS. 1A and 1B in a row direction; $Y_1$, $Y_2$ are bit lines connecting the drain regions 2c in a column direction; and S is a source line commonly connecting the source regions 2d.

Now, the operation of the above described conventional device is explained.

(1) READING: The word line selected is biased to a high voltage, for example, 5 V and the other word line is biased to a low voltage, for example, 0 V. Also, the bit line selected is put to 1 V and the other bit line is put to an open state. This selected bit line is connected to a sense amplifier. Consequently, the current that corresponds to the threshold value of the memory transistor at an intersection point of the selected word line and the selected bit line flows in the selected bit line. That is, if the threshold value of the transistor is lower than 5 V, the channel current flows and, if the same is higher than 5 V, no current flows. The sense amplifier detects the potential changes taking place at the node (intersection) due to the presence or absence of the current.

(2) WRITING: The word line selected is biased to a high voltage, for example, 13 V and the other word line is biased to a low voltage, for example, 0 V. Also, the bit line selected is put to 7 V and the other bit line is made open. Consequently, the channel current flows only to the transistor at the intersection of the selected word line and the selected bit line with the hot electrons being produced and the electrons being injected to the floating gate electrode 4. In the same manner, the memory transistors to be written-in are consecutively selected.

(3) ERASING: In the case of EPROM, the entire surface is subjected to irradiation by ultraviolet light. In the case of FEPROM, all the word lines are put to a low voltage, for example, 0 V and all the bit lines are made open, with a high voltage, for example, 12 V being applied to the source line. Consequently, the electric field between the source and the floating gate electrode becomes strong thereby causing the discharge of electrons from the floating gate electrode to the source electrode, which results in the data erasing.

The conventional device described above has the following structural characteristics which result in the problems also explained below.

1) The source/drain regions are formed within the surface region of the semiconductor substrate.

2) The channel region is formed using the surface of the semiconductor substrate.

3) Device isolation is effected by means of a thick insulating film formed on the surface of the substrate and an impurity diffusion layer formed under the insulating film.

The problems resulting from the above are:

I) The substrate has a fixed constant potential but, in view of 1) above, there is produced a depletion layer between the drain electrode and the substrate, causing the generation of a diffusion layer capacitance, the value of which is dependent on the total area of the drain region and the amount of impurity concentration of the substrate. Under the condition of the substrate concentration being $7 \times 10^{16}$ cm$^{-3}$, $V_D = 1$ V, the capacitance per $\mu$m$^2$ is about $1 \times 10^{-3}$ pF. In the actual fabricated device, since many memory transistors are connected to the bit line, the bit line capacitance becomes several pF. However, when the device capacity is increased, since the charging-up of the drain voltage is delayed in proportion to a time-constant given by the product of the bit line capacitance and the resistance of the bias transistor and the discharging is delayed in proportion to a time-constant given by the product of the bit line capacitance and the resistance of the cell transistor, so that this structure suffers from the problem of a slower reading speed.

II) Since the drain region is formed in the surface region of the substrate as described in 1) above, junction leakage occurs where there is a defect in the drain depletion layer. Unless this leakage current is negligibly small when compared with the current for reading the cells, it becomes impossible to read the data from the written-in cell. Especially, this structure is susceptible to crystallization defects in the region adjacent to the thick insulating film for device isolation, and such phenomena result in the lowering of the production yield.

III) Since the source region is formed in the surface region of the substrate as described in 1) above, where a high voltage is to be applied to the source electrode for effecting the data erasing, an avalanche breakdown current or a leakage current in addition to the Fowler-Nordheim tunneling current is produced and is caused to flow into the substrate. Consequently, if the source voltage is applied by means such as a charge pump power source in which the voltage is raised from a low power source voltage, voltage drop occurs due to a power supply shortage and this results in the inability to maintain the voltage required for the data erasing operation.

IV) In view of 2) above, the threshold value $V_{TM}$ of the memory transistor changes depending on the substrate potential $V_{SUB}$ according to the following equation:

$$V_{TM} = V_{TMO} + \sqrt{(4\epsilon_{Si}\epsilon_0 q N_A \phi_f)/C_{OX}} + \sqrt{\{2\epsilon_{Si}\epsilon_0 q N_A(|V_{SUB}|+2\phi_f)\}/C_{OX}}$$

Here, $V_{TMO}$ is $V_{TM}$ when $V_{SUB}=0$ V, $\epsilon_{Si}$ is the dielectric constant of Si (silicon), $\epsilon_O$ is the dielectric constant for vacuum, q is the amount of electron charge, $N_A$ is the amount of impurity concentration of the substrate, ⌀f is the Fermi energy level, and $C_{OX}$ is a gate oxide film capacitance.

Thus, when the substrate potential is applied, the threshold value $V_{TM}$ of the memory transistor rises. On the other hand, the diffusion layer capacitance lowers when the substrate potential is applied and this is an advantage to the high speed operation of peripheral transistors. For this reason, the substrate biasing method is generally used for memories such as a dynamic random access memory (DRAM). However, in the EPROM or FEPROM, the impurity concentration of the channel section is high and the rise of the threshold value $V_{TM}$ due to the substrate biasing is large resulting in a large trade-off with respect to the speeding up of peripheral circuit sections, and thus the substrate biasing method cannot be employed.

V) Generally, the formation of the thick insulating film referred to under 3) above employs a selective oxidation method which is called "LOCOS (Local Oxidation of Silicon)". However, when this method is used, erosion resulting in "bird's beaks" occurs in the isolation insulating film toward the channel region, which may also spread to the impurity channel region formed under the insulating film. Consequently, the problem presented is that the narrow channel effect markedly increases with the effective channel width becoming smaller than the initial patterning channel width.

SUMMARY OF THE INVENTION

It is, therefore, an object of the present invention to provide a non-volatile semiconductor memory device having a plurality of thin film transistors equipped with floating gate electrodes, which overcomes the problems existing in the non-volatile semiconductor memory device described above.

According to one aspect of the invention, there is provided a non-volatile semiconductor memory device having a plurality of thin film memory transistors, each of the thin film memory transistors comprising:

a control gate electrode formed on an insulating film on a semiconductor substrate;

a first gate insulating film covering the control gate electrode;

a floating gate electrode formed on the first gate insulating film;

a second gate insulating film provided on the floating gate electrode;

a channel region of a first conductivity type semiconductor film provided on the second gate insulating film; and source/drain regions of a second conductivity type semiconductor film formed with the channel region being interposed therebetween.

The advantages achieved by the present invention are as follows:

I) Since the capacitance of the impurity diffusion layer is small, the bit line capacitance can be reduced thereby giving a high speed operation.

II) Since there is no junction leakage current to the substrate electrodes, it is possible to perform a stable data reading operation and to fabricate the device with high production yield.

III) Since there is no breakdown current or channel leakage current to the substrate where a high voltage is applied, the load to the power supply circuit during the data erasing operation is reduced so that the voltage drop in the internal power supply source is restricted whereby a stable erasing operation is made possible.

IV) Even when bias is applied to the substrate, there is little change in the threshold value in the memory transistor. For this reason, it is possible to avoid the occurrence of data reading errors and yet to realize the speeding up of the operation of the peripheral circuits.

V) Since the device isolation can be realized without using a channel stopper or a field oxide film, it is possible to have the narrow channel effect restricted and to make the effective size of the device closer to the designed value.

VI) Since the device can be fabricated by having transistors stacked one over another, it is possible to enhance the degree of integration of the device.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, preferred embodiments according to the invention are explained with reference to the accompanying drawings. It is to be noted that, throughout the following explanation, similar reference symbols or numerals refer to the same or similar elements in all figures of the drawings.

Figure 3A:
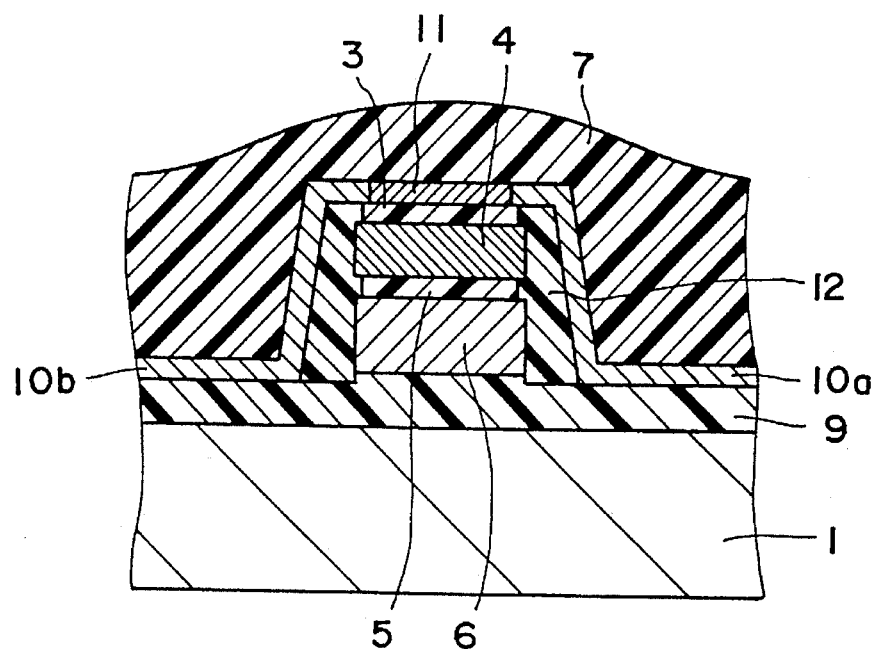
FIGS. 3A and 3B are sectional views showing an N-channel memory transistor as a first embodiment according to the invention.
Figure 3B:
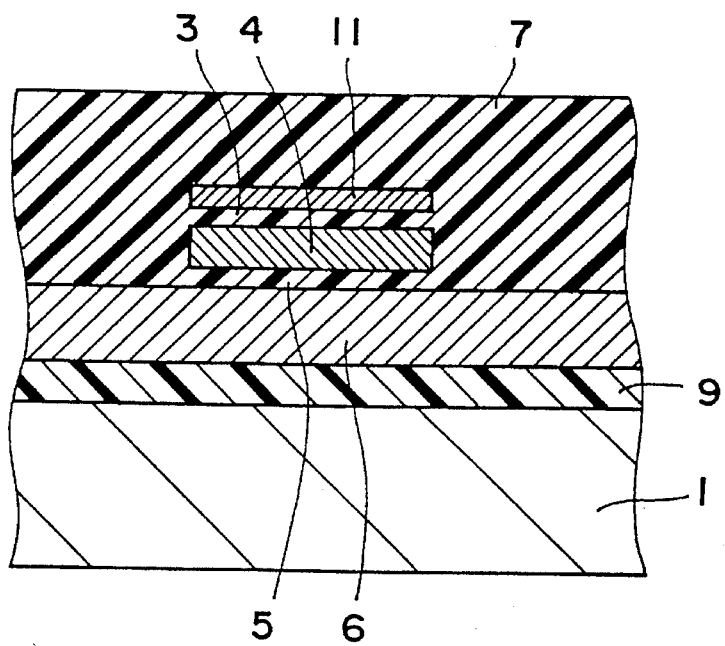

FIGS. 3A and 3B show an N-channel memory transistor as a first embodiment according to the invention. FIG. 3A is a cross-sectional view of the transistor seen from a channel length direction and FIG. 3B is a cross-sectional view seen from a channel width direction thereof. The transistor includes a P-type semiconductor substrate 1 having an impurity concentration of $1 \times 10^{15}$ cm$^{-3}$; a silicon oxide film ($SiO_2$) 9 having a thickness of 5000 Angstroms; a control gate electrode 6 constituted by a polysilicon (also called polycrystalline silicon) film 3000 Angstroms thick formed by being P (phosphor) doped to a concentration of $1 \times 10^{21}$ cm$^{-3}$; an FG-CG gate insulating film 5 constituted by three layers, namely, an $SiO_2$ film 50 Angstroms thick formed by a chemical vapor deposition (CVD) process, an $Si_3N_4$ film 70 Angstroms thick, and an $SiO_2$ film formed by the CVD process; a floating gate electrode 4 constituted by a polysilicon film 1500 Angstroms thick formed by being P (phosphor) doped to a concentration of $5 \times 10^{20}$ cm$^{-3}$; and a C-FG gate insulating film 3 (250 Angstroms thick) constituted by an $SiO_2$ film formed by the CVD process.

The transistor also includes a channel region 11 constituted by an amorphous silicon film 400 Angstroms thick formed by being B (boron) doped to a concentration of $1 \times 10^{16}$ cm$^{-3}$; and a drain region 10a and a source region 10b 400 Angstroms thick formed by being As (arsenic) doped to a concentration of $1 \times 10^{21}$ cm$^{-3}$. The drain/source regions 10a and 10b are insulated respectively from the control gate electrode 6 and the floating gate electrode 4 by sidewall oxide films 12 and also insulated from the substrate 1 by the $SiO_2$ film 9 on the substrate 1. The numeral 7 indicates an interlayer insulating film 7000 thick of BPSG (Boro-phosphosilicate glass).

Figure 1A:
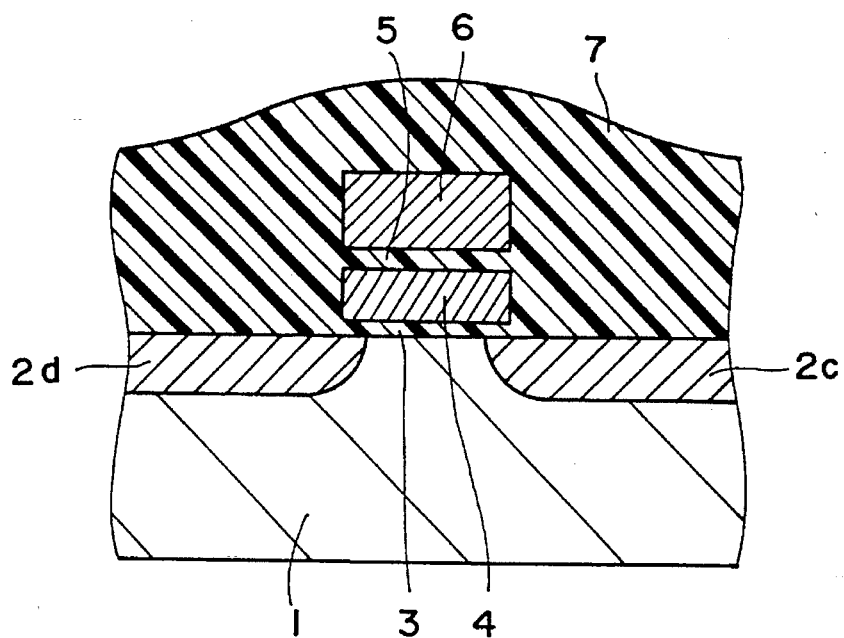
FIGS. 1A and 1B are a longitudinal cross-sectional view and a transverse cross-sectional view, respectively, of a conventional non-volatile semiconductor memory device.
Figure 1B:
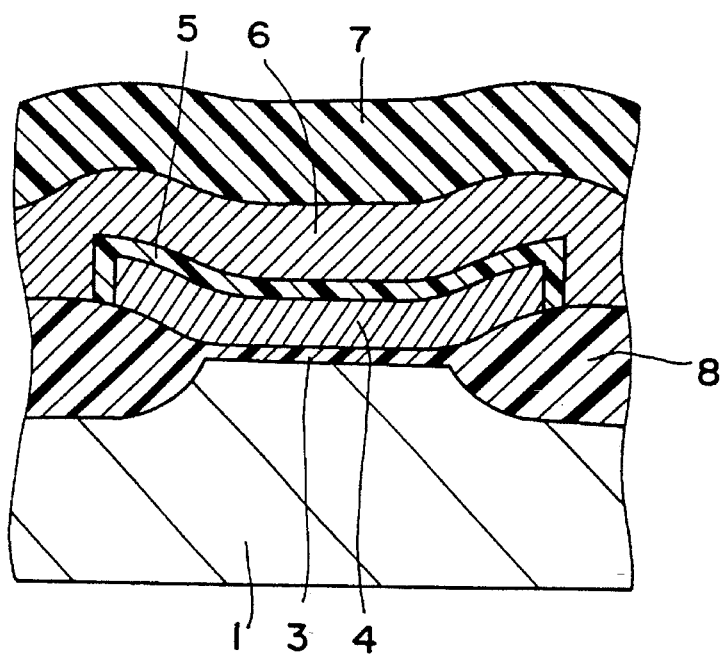
Figure 2:
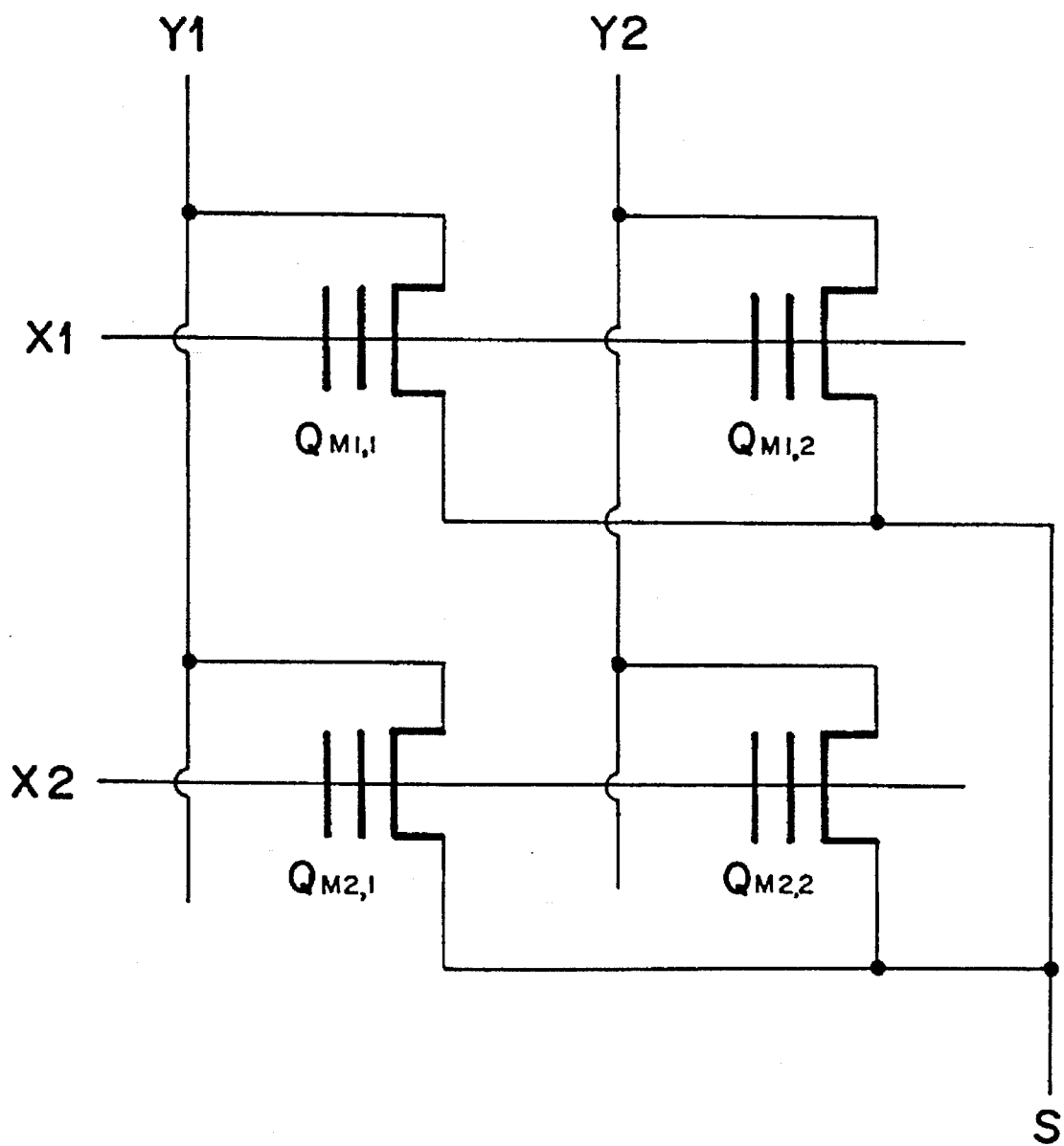
FIG. 2 is an equivalent circuit diagram for an ordinary memory array which is used in an EPROM and a flash EPROM.

The feature of this embodiment resides in the arrangement wherein the source, drain and channel regions (10b, 10a and 11) are formed in a semiconductor thin film on a relatively thick $SiO_2$ film 9 on the substrate 1. Because of this, the potential of the channel region is in a floating state. However, it has been confirmed by experiments that, if the thickness of the semiconductor thin film of the channel region is smaller than 700 Angstroms, the thin film potential at the channel region can be controlled by a gate electric field. Thus, the thin film memory transistor structured according to this embodiment operates in the same way as the conventional memory transistor shown in FIGS. 1A and 1B. This means that the array can be laid out in the same manner as that in the conventional memory transistor. An equivalent circuit diagram of the memory transistor according to this embodiment is the same as that shown in FIG. 2 for the conventional one.

The advantages of the thin memory transistor according to the embodiment of the invention are explained hereafter.

I) Since the capacitance between the drain electrode 10a and the substrate 1 is the capacitance between the semiconductor regions through the thick $SiO_2$ film 9, it is possible to make this capacitance small. Specifically, the capacitance in the case where the $SiO_2$ film 9 is 5000 Angstroms thick is about $1 \times 10^{-4}$ pF per $\mu m^2$ and, thus, tile capacitance can be reduced to about one tenth of the capacitance of the diffusion layer on the substrate of the prior art. This enables the bit line capacitance to be significantly reduced thereby making high speed operation possible.

II) Since both the drain region and the source region are isolated by the insulating film, there is no junction leakage other than that at the junction with the channel region. Thus, it is possible to fabricate the device with a high production yield.

III) Since there is no substrate electrode, even where the occurrence of avalanche breakdown or channel leakage is caused by the applying of a high voltage to the source side during the data erasing operation, the leakage current cannot flow to anywhere other than to the bit lines. Thus, if the bit lines are made open, the current flow can be limited to the Fowler-Nordheim current. This makes the data erasing possible by using, for example, an internal charge pump power supply.

IV) The electric field due to the substrate potential of the substrate 1 is shielded by the control gate electrode 6 and the floating gate electrode 4 and does not have any influence on the channel region of the thin film transistor. Thus, even where a negative biasing is applied to the substrate, for purposes of reducing the capacitance of peripheral circuits and realizing a higher speed of operation, there is no rise in the threshold values in the thin film memory transistor and no decrease in ON currents.

V) Since the active element is the thin film transistor on the insulating film, there is no need to use a high impurity concentration channel stopper or a thick field oxide film for element isolation and this ensures that there is no occurrence of narrow channel effects unlike the conventional arrangement. Thus, the effective dimensions of the elements are determined only by patterning widths of the thin film semiconductor and no restrictions presented by the reduction in element widths arise.

Figure 4A:
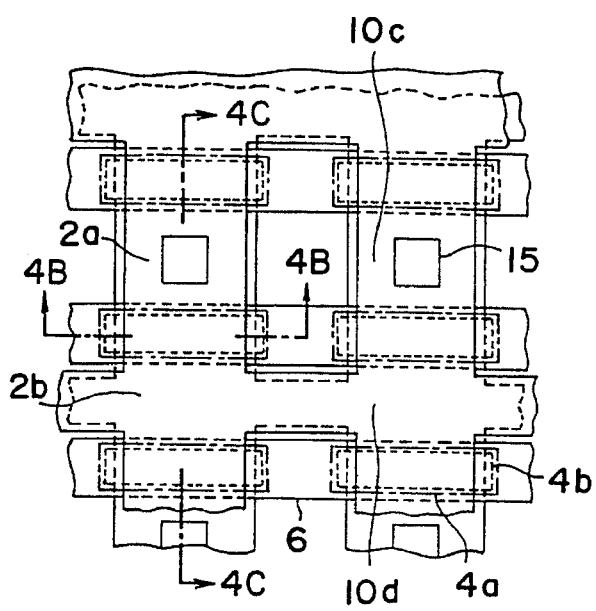
FIGS. 4A, 4B and 4C are diagrams showing an N-channel memory transistor as a second embodiment according to the invention, FIG. 4A being a plan view of the transistor, FIG. 4B being a sectional view thereof taken along the line B—B in FIG. 4A, and FIG. 4C being a sectional view taken along the line C—C in FIG. 4A.
Figure 4C:
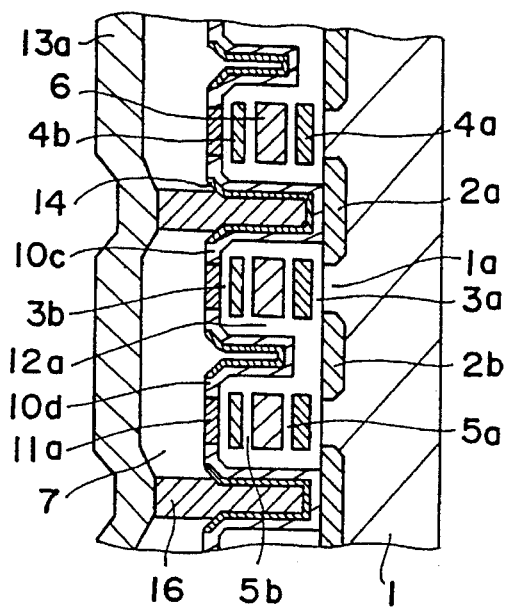
Figure 4B:
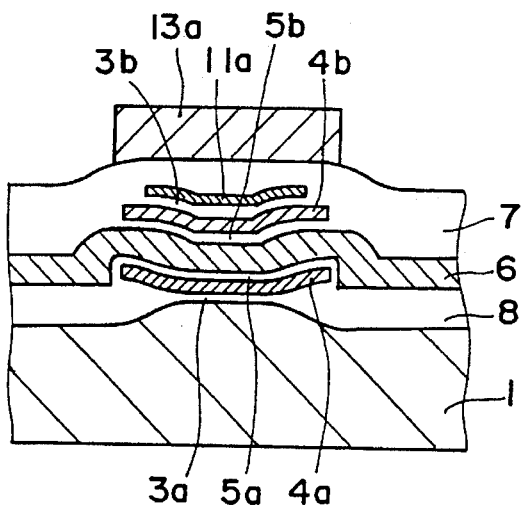
Figure 5A:
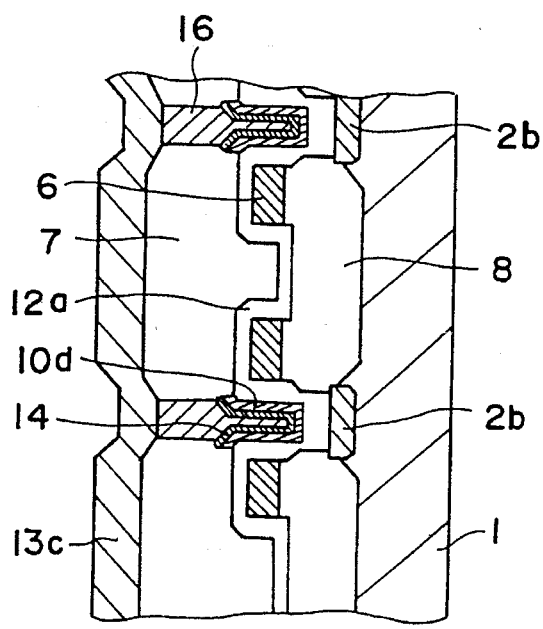
FIGS. 5A, 5B, 5C and 5D are respective sectional views of source contact sections of the memory device according to the invention.
Figure 5B:
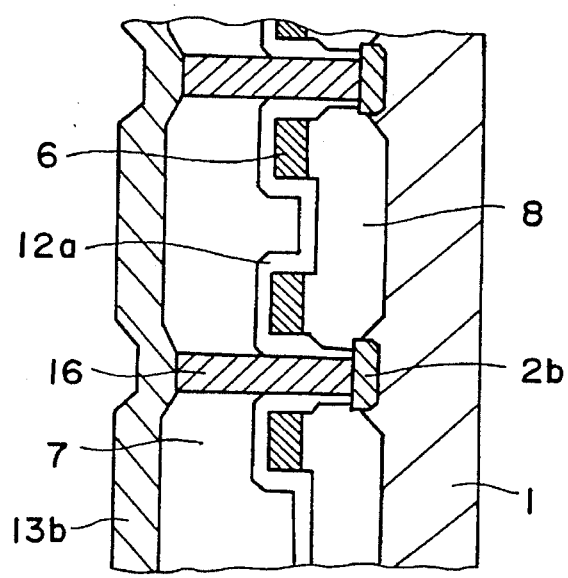
Figure 5C:
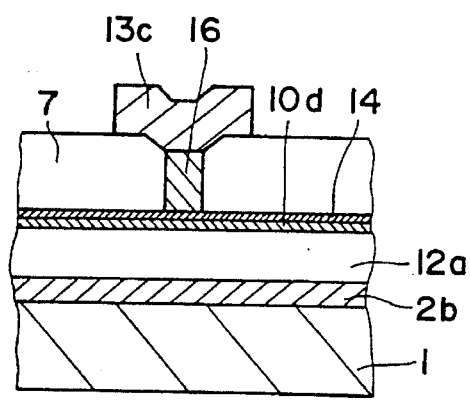
Figure 5D:
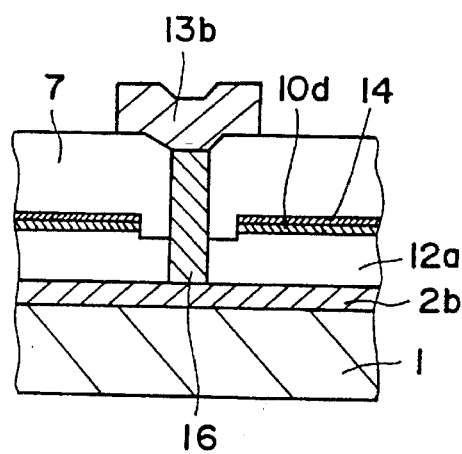

FIGS. 4A, 4B and 4C show an N-channel memory transistor as a second embodiment according to the invention. FIG. 4A is a plan view of the transistor, FIG. 4B is a sectional view thereof taken along the line B—B in FIG. 4A, and FIG. 4C is a sectional view taken along the line C—C line in FIG. 4A.

The transistor shown includes a semiconductor substrate 1 in which boron (B) is doped and has a surface impurity concentration of $3 \times 10^{16}$ cm$^{-3}$; a first channel region 1a on the surface of the substrate 1; a first drain region 2a and a first source region 2b each formed by being arsenic (As) doped to a concentration of $5 \times 10^{21}$ cm$^{-3}$; and a field insulating film 8 constituted by a silicon oxide ($SiO_2$) film 8 (8000 Angstroms thick) for isolating the active area; a first C-FG gate insulating film 3a constituted by a thermal oxide film $SiO_2$ 250 Angstroms thick; a first floating gate electrode 4a constituted by a polysilicon film 1500 Angstroms thick formed by being phosphor (P) doped to a concentration of $5 \times 10^{20}$ cm$^{-3}$; a first FG-CG gate insulating film 5a constituted by a three layer structure, namely, the structure of, from the lower layer, an $SiO_2$ film 40 Angstroms thick formed by the CVD process, an $Si_3N_4$ film 70 Angstroms thick formed by the CVD process and an $SiO_2$ film 60 Angstroms thick formed by the CVD process; and a control gate electrode 6 constituted by two layers, namely, a polysilicon film 1500 Angstroms thick formed by being phosphor (P) doped to an impurity concentration of $1 \times 10^{20}$ cm$^{-3}$ and a WSi film 1500 Angstroms thick.

The substrate memory transistor constituted by the control gate electrode 6, the first floating gate electrode 4a, the first channel region 1a, and the first drain/source regions 2a, 2b serves as a first memory transistor.

The transistor also includes a second FG-CG gate insulating film 5b constituted by a three layer structure, namely, the structure of, from a lower layer, an $SiO_2$ film 60 Angstroms thick formed by the CVD process, an $Si_3N_4$ film 70 Angstroms thick formed by the CVD process and an $SiO_2$ film 40 Angstroms thick formed by the CVD process; a second floating gate electrode 4b constituted by a polysilicon film formed by being phosphor (P) doped to an impurity concentration of $5\times10^{20}$ cm$^{-3}$; a second C-FG gate insulating film 3b constituted by an $SiO_2$ film 350 Angstroms thick formed by the CVD process; a second channel region 11a constituted by an amorphous silicon film 500 Angstroms thick formed by being boron (B) doped to an impurity concentration of $1\times10^{16}$ cm$^{-3}$; second drain/source regions 10c, 10d each constituted by an amorphous silicon film 500 Angstroms thick formed by having arsenic (As) doped to an impurity concentration of $1\times10^{20}$ cm$^{-3}$; a $TiSi_2$ film 14 formed on a surface of the source/drain regions for lowering their resistance; and a sidewall oxide film 12a for insulating the drain/source regions 10a, 10b from the floating gate electrode 4a, 4b and the control gate electrode 6.

In the formation of the $TiSi_2$ film 14, an $SiO_2$ layer is formed on the second channel region 11a and the drain/source regions 10a, 10b adjacent thereto, is sputtered with Ti, and is dipped in a solution of $NH_4OH$ and $H_2O_2$ after being silicided by sintering under a temperature of 650° C.

The control gate electrode 6, the second floating gate electrode 4b, the second channel region 11a, and the second drain/source regions 10c, 10d constitute a thin film memory transistor which is a second memory transistor.

As shown in FIG. 4C, the second drain region 10c is connected with the first drain region 2a. The second source region 10d is insulated from the first source region 2b.

The memory transistor is provided with an interlayer film 7 which has a lower layer 2000 Angstroms thick constituted by an $SiO_2$ film formed by the CVD process and an upper layer 2000 Angstroms thick constituted by a BPSG film; a contact hole 15 for interconnecting the first drain region and the second drain region; a silicon plug 16 of polysilicon formed by being phosphor (P) doped to an impurity concentration of $1\times10^{21}$ cm$^{-3}$, and a metal interconnection wiring 13a.

FIGS. 5A–5D are respective sectional views of source contact sections. The numeral 13b therein shows a metal interconnection wiring connected to the first source region 2b and the numeral 13c shows metal interconnection wiring connected to the second source region 10d.

Next, the arrangements relating to electrical connections in this embodiment are explained with reference to FIGS. 4A to 4D and FIGS. 5A to 5D as well as FIG. 6 which is an equivalent circuit diagram for this embodiment.

The control gate electrodes 6 are interconnected in the row direction thereby forming the word lines X1 and X2; the first and second drain regions are interconnected in the column direction through the metal interconnect wiring 13a which forms the bit lines Y1 and Y2; the first source regions 2b are interconnected through the impurity diffusion layer in the row direction and are also commonly connected with each other through the metal interconnection wiring 13b which is to become the first source line S1; the second source regions 10d are interconnected through the amorphous silicon film and the silicide film in the row direction and are also commonly connected with each other through the metal interconnection wiring 13c which is the second source line S2.

Figure 6:
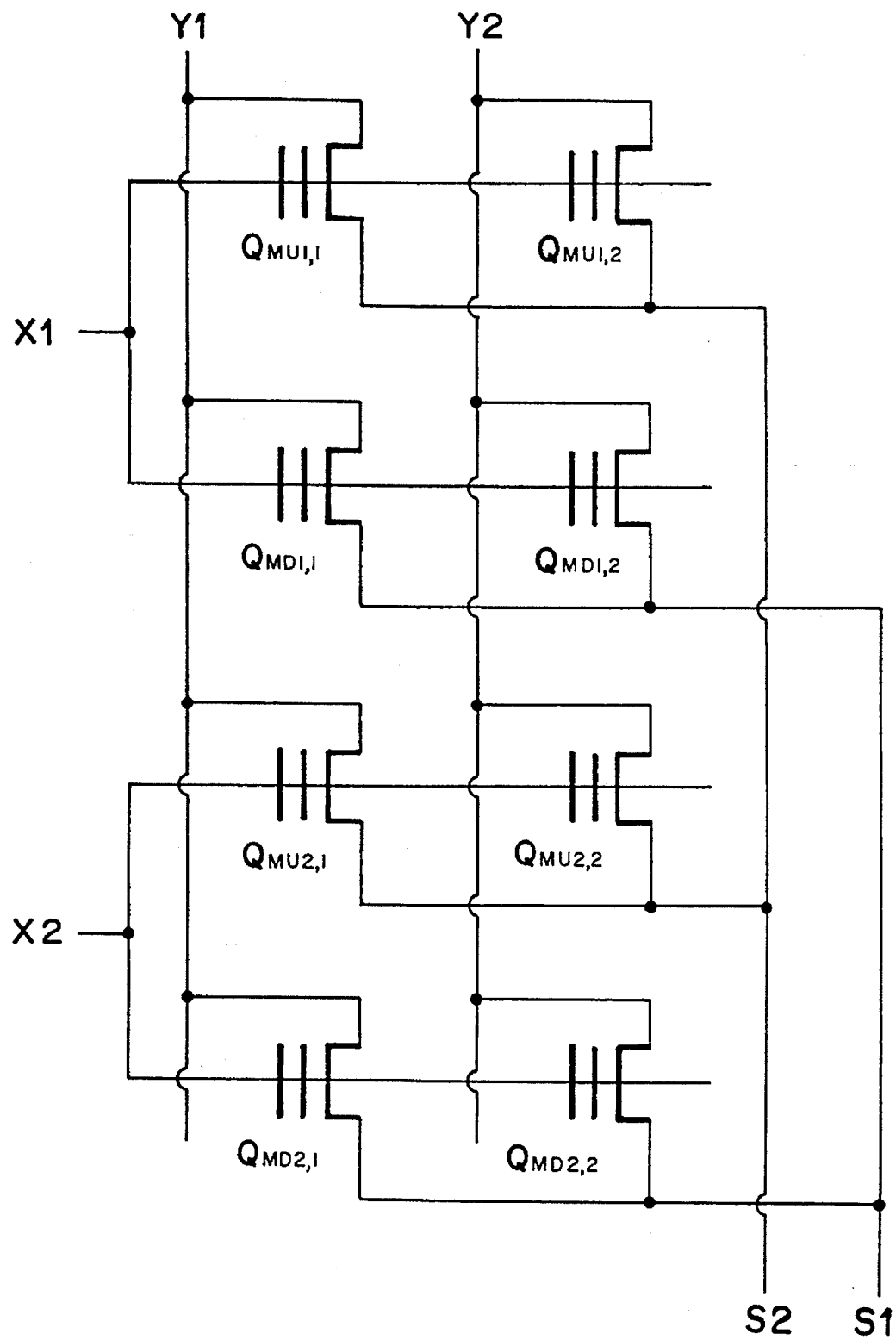
FIG. 6 is an equivalent circuit diagram of a memory device of a second embodiment according to the invention.

In FIG. 6, $Q_{MDi,j}$ (i=1,2, j=1,2) indicates the first memory transistor and $Q_{MUi,j}$ (i=1,2, j=1,2) indicates the second memory transistor shown in FIGS. 4A–4C.

Now, the operation of the device according to this second embodiment is explained.

(1) READING: The word line selected is biased to a high voltage, for example, 5 V and the other word line is biased to a low voltage, for example, 0 V. Also, the bit line selected is put to 1 V and the other bit line is made open. Also, the source line which the memory transistor selects from the first and second source lines is put to a low voltage, for example, 0 V while the other source line is made open. Consequently, there is a channel current flow only in the memory transistor in which the source line from one of the paired memory transistors connected with the selected word line is biased. Here, if the threshold value of the transistor is lower than 5 V, the channel current flows and, if such value is higher than 5 V, no current flows. The potential changes that take place at the node due to the presence or absence of the current are compared with the reference voltage at the sense amplifier from which the sense amplifier output is obtained.

(2) WRITING: The word line selected is biased to a high voltage, for example, 13 V and the other word line is biased to a low voltage, for example, 0 V. Also, the bit line selected is put to an intermediate voltage, for example, 7 V and the other bit line is made open. Furthermore, the source line out of the first and the second source line with which the memory transistor to be written is connected is put to a low voltage of 0 V and the other source line is left open. No channel current flows to the transistor at the side where the source line is in an open state and, consequently, no hot electrons are generated and no writing is performed. To the memory transistor at the side where the source line is 0 V, the channel current flows thereby generating hot electrons and causing the electrons to be injected into the floating gate electrode.

(3) ERASING: In the case of EPROM, the entire surface is subjected to irradiation by ultraviolet light. In the case of FEPROM, the word lines are put to a low voltage, for example, 0 V and all the bit lines are made open, with a high voltage, for example, 12 V being applied to the first and second source lines S1 and S2. Consequently, the electric field between the source and the floating gate electrode becomes strong thereby causing the discharge of electrons from the floating gate electrode to the source electrode, which results in data erasing. Alternatively, all the bit lines may be made open with a negative voltage of, for example, −7 V being applied to the word lines X1, X2 and a positive voltage of, for example, 5 V being applied to the first and second source lines S1, S2 and, in this way, the same erasing as above can be achieved.

The advantage achieved in the second embodiment explained above is that, since the thin film memory transistor is placed on the conventional substrate memory transistor in such a manner that the control gate electrode is common to both the transistors, it is made possible to enhance the degree of integration quite significantly.

It is possible to modify the device of the second embodiment such that the lower transistor is also a thin film memory transistor and this will further enhance the degree of integration in memory transistors.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A non-volatile semiconductor memory device having a plurality of stacked memory transistors, each of the stacked memory transistors comprising:

a first channel region provided in a surface region of a semiconductor substrate of a first conductivity type;

first source/drain regions of a second conductivity type provided in the surface region of said semiconductor substrate, said first channel region being provided between said first source/drain regions;

a first gate insulating film covering said first channel region;

a first floating gate electrode provided on said first gate insulating film;

a second gate insulating film covering said first floating gate electrode;

a control gate electrode provided on said second gate insulating film;

a third gate insulating film covering said control gate electrode;

a second floating gate electrode provided on said third gate insulating film;

a fourth gate insulating film covering said second floating gate electrode;

a second channel region of the first conductivity type semiconductor thin film provided over said second floating gate electrode with said fourth gate insulating film being interposed therebetween; and second source/drain regions of the second conductivity type semiconductor thin film formed with said second channel region being interposed therebetween said stacked memory transistors being disposed in a matrix form, said first drain and the second drain regions of the stacked memory transistors being connected by bit lines in a column direction and said control gate electrodes of the stacked memory transistors being connected by word lines in a row direction, said first source regions of the stacked memory transistors being commonly connected to form a first source line, said second source regions of the stacked memory transistors being commonly connected to form a second source line, and a particular one of said stacked memory transistors being selected by said word lines, said bit lines and either one of said first and second source lines.

* * * * *